United States Patent
Orefice et al.

(10) Patent No.: US 12,216,865 B2
(45) Date of Patent: Feb. 4, 2025

(54) CONTACTLESS ELEMENT DETECTION DEVICE

(71) Applicant: COMMISSARIAT A L'ENERGIE ATOMIQUE ET AUX ENERGIES ALTERNATIVES, Paris (FR)

(72) Inventors: Pierre-Henri Orefice, Gif sur Yvette (FR); Charles Hudin, Gif sur Yvette (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 7 days.

(21) Appl. No.: 18/254,481

(22) PCT Filed: Nov. 24, 2021

(86) PCT No.: PCT/FR2021/052080
§ 371 (c)(1),
(2) Date: May 25, 2023

(87) PCT Pub. No.: WO2022/112712
PCT Pub. Date: Jun. 2, 2022

(65) Prior Publication Data
US 2024/0053854 A1 Feb. 15, 2024

(30) Foreign Application Priority Data
Nov. 26, 2020 (FR) ........................................ 2012214

(51) Int. Cl.
*G06F 3/043* (2006.01)
*G01R 23/02* (2006.01)
(Continued)

(52) U.S. Cl.
CPC ............. *G06F 3/043* (2013.01); *G01R 23/02* (2013.01); *G01S 15/876* (2013.01); *G06F 3/017* (2013.01); *G06F 2203/04108* (2013.01)

(58) Field of Classification Search
CPC ........... G06F 3/017; G06F 2203/04108; G06F 3/043; G06F 3/011; G06F 3/0436; G01S 15/66; G01S 15/876; G01S 15/003
See application file for complete search history.

(56) References Cited

U.S. PATENT DOCUMENTS 7,978,091 B2 * 7/2011 Boillot ..................... H03G 3/02
340/567
9,367,178 B2 * 6/2016 Dahl ..................... G01S 15/003
(Continued)

FOREIGN PATENT DOCUMENTS

WO WO 2011/048433 A1 4/2011

OTHER PUBLICATIONS

International Search Report mailed on Mar. 24, 2022 in PCT/FR2021/052080 filed on Nov. 24, 2021 (3 pages).
(Continued)

*Primary Examiner* — Olga V Merkoulova
(74) *Attorney, Agent, or Firm* — Oblon, McClelland, Maier & Neustadt, L.L.P.

(57) ABSTRACT

A contactless detection device, comprising a detection surface; a plurality of actuators acoustically coupled to the detection surface; an ultrasonic acoustic wave detector; an electronic and/or IT computer, the device being configured to detect one or more element(s) by repeating the following steps: focusing ultrasonic acoustic waves emitted by the actuators into a focusing region, obtained from waves emitted by the actuators and to which a first time reversal method has been applied, and measuring a duration between emitting the waves and receiving an echo of these waves by the
(Continued)

detector, wherein the computer is configured to calculate the control signals such that the detection waves are focused successively into focusing regions of different shape and/or sizes.

14 Claims, 4 Drawing Sheets

(51) Int. Cl.
*G01S 15/87* (2006.01)
*G06F 3/01* (2006.01)

(56) References Cited

U.S. PATENT DOCUMENTS

| | | | | |
|---|---|---|---|---|
| 10,013,119 | B2* | 7/2018 | Dahl | G06F 3/043 |
| 2006/0238490 | A1* | 10/2006 | Stanley | G06F 3/0421 |
| | | | | 345/156 |
| 2007/0288194 | A1* | 12/2007 | Boillot | G06F 3/0304 |
| | | | | 702/150 |
| 2008/0048878 | A1* | 2/2008 | Boillot | G06F 3/0485 |
| | | | | 381/105 |
| 2008/0100572 | A1* | 5/2008 | Boillot | G06F 3/0346 |
| | | | | 345/158 |
| 2011/0254762 | A1* | 10/2011 | Dahl | G06F 3/043 |
| | | | | 341/20 |
| 2012/0299820 | A1* | 11/2012 | Dahl | G01S 15/003 |
| | | | | 345/156 |
| 2016/0253045 | A1* | 9/2016 | Dahl | G06F 3/011 |
| | | | | 345/177 |
| 2018/0032211 | A1* | 2/2018 | King | G06F 3/04186 |

OTHER PUBLICATIONS

Chiu et al., "Implementation of ultrasonic touchless interactive panel using the polymer-based CMUT array" IEEE Sensors, 2009, Piscataway, NJ, USA, Oct. 25, 2009 (Oct. 25, 2009), pp. 625-630, XP031618733.

* cited by examiner

CONTACTLESS ELEMENT DETECTION DEVICE

TECHNICAL FIELD AND PRIOR ART

The invention relates to the field of detection and remote interaction, without contact, with one or more element(s). More particularly, the invention relates to a device enabling one or more element(s) to interact with this device, without the need for contact between the device and the element(s), as well as a method for controlling such a device.

A contactless element detection device allows determining or characterising the presence, the position or the movement of one or more element(s), for example the fingers or the hands of one or more user(s), located at some distance from the device. From the performed detection, an interaction then becomes possible between the detected element(s) and the device.

There are several technologies for making such a device.

For example, it is possible to make a contactless element detection device using the principle of optical capture, using one or more camera(s), laser(s) or infrared sensor(s). Nonetheless, such a device is very sensitive to the optical conditions of the environment in which it is used. In addition, when such a device is used so that the user could interact with virtual 3D objects, the computing power necessary for the operation of the device is very high because of the analysis of the captured images having to be carried out. Furthermore, using lasers to carry out the optical capture is an expensive solution. Finally, using infrared sensors to carry out the optical capture also has several drawbacks: large size, a small perception area, need for a large number of sensors to have a sufficient representation of the observed area. Privacy invasion problems might also arise with such a device because the optical capture acquires everything found around the element(s) to be detected, like for example the face of the user.

It is also possible to make a contactless element detection device using miniature radars. Nonetheless, the obtained performances are not satisfactory, especially if the object to be detected is not metallic (like for example a hand or a finger).

Contactless element detection devices using WiFi waves, or shorter electromagnetic waves, have also been proposed. Nonetheless, these solutions require complex external components that run the risk of saturating the communication network with which the device communicates.

It has also been proposed to make contactless element detection devices using capacitive matrices. Nonetheless, these matrices perform poorly beyond a few centimetres of distance between the matrix and the element(s) to be detected, and could be disturbed by surrounding electric fields.

Contactless detection and interaction techniques implemented using the microphones and loudspeakers of mobile phones, or smartphones, have also been suggested. Some of these techniques carry out a gesture detection by using measurements of frequency shifts and phase disturbances induced by a movement on acoustic waves emitted by the microphone(s) of the telephone. A prior learning allows associating different gestures with the disturbances induced by the gestures made by the user on the emitted acoustic waves. Nonetheless, these techniques do not allow carrying out an accurate localisation of the element(s) to be detected if these are stationary, and therefore do not allow carrying out, for example, a detection of manipulation of virtual 3D objects or movement of a virtual cursor, for example. Furthermore, the detected gestures should necessarily be predefined by the manufacturer of the device. Other techniques allow tracking the movement of an element to be detected and locating this element in space by triangulation, monitoring of the time-of-flight, phase shift or impulse response. Nonetheless, the measurements made are not very accurate and the trajectory reconstruction should generally be corrected thanks to the Doppler effect or phase change tracking, which allow determining the direction, the speed of the movement and the travelled distance. These techniques do not improve the detection of quasi-static interaction (i.e. with a low-amplitude movement), making these movements difficult to measure, and do not allow distinguishing between several elements detected simultaneously such as several fingers of a user.

Compared to the systems listed before, the ultrasonic remote detection technology has many advantages: compactness of the used components, insensitivity to the optical conditions of use, possibility of operation through opaque surfaces, limited computing power required, absence of problem of invasion of privacy, possibility of detection of many materials (few materials do not reflect acoustic waves), insensitivity to electromagnetic disturbances.

The document by Yun, S. et al., "Strata: Fine-grained acoustic-based device-free tracking", 2017, Proceedings of the 15th Annual International Conference on Mobile Systems, Applications, and Services, pp. 15-28, describes an algorithm enabling a smartphone to detect the position and the trajectory of a finger without contact with the latter, in real-time. By using the two microphones of the smartphone, this algorithm allows following the trajectory of a finger in a two-dimensional plane at some distance from the smartphone. Nonetheless, this solution has several drawbacks: need to define beforehand a range of possible interaction distances between the finger to be detected and the smartphone, need to have a movement of the finger, impossibility of detecting and making a distinction between several fingers, a solution that is not very robust due to the fact that the determination of the position of the finger is obtained by carrying out an optimisation involving the phase shift, itself dependent on the choice of the path of reflection which depends on the absolute position of the finger, the trajectory tracking of the finger is possible only in the selected two-dimensional plane.

The document by Etaix, N. et al., "Acoustic imaging device with one transducer", The Journal of the Acoustical Society of America 131, 2012, EL395-EL399, describes a detection technique using a time reversal method in order to carry out 3D imaging. Several piezoelectric actuators are disposed on a so-called "chaotic" metal plate including cavities randomly drilled in the plate. A known signal is generated by each actuator and the corresponding step response at each point of the surface of the plate is measured with a vibrometer. The time reversal method is applied to the signals which are modified afterwards by a mathematical function. By applying these new signals to the actuators, acoustic waves are then focused at a selected point of space. Afterwards, a plane is scanned at a selected altitude and the echo is observed thanks to a microphone. A time window which corresponds to the theoretical time that an echo potential would take to return to the microphone after a reflection at a distance D from the plate is selected. By measuring the maximum amplitude of the sound in this time window, the presence, or not, of an object at the distance D, placed at the selected focusing coordinates, is determined. In this document, the plane located at the distance D from the plate is scanned by focusing the acoustic waves point-bypoint then by analysing each time window. In addition, several planes must be completely scanned point-by-point to have a complete 3D image of the environment. Hence, this results in a very long acquisition time.

DISCLOSURE OF THE INVENTION

The present invention is intended to provide a contactless detection device based on the use of ultrasonic acoustic waves and having none of the above-mentioned drawbacks, i.e. which is capable of interacting through a detection of the position and/or of the movement of one or more element(s) simultaneously, these elements being possibly located, or not, in planes located at different distances from the device, and that being so with a short acquisition time.

For this purpose, the present invention provides a contactless detection device, including at least:
- a detection surface;
- several actuators, for example piezoelectric, acoustically coupled to the detection surface and configured to emit ultrasonic acoustic waves;
- an ultrasonic acoustic wave detector;
- an electronic and/or IT computer;
- the device being configured to carry out a detection of one or more element(s) by implementing the following steps several times:
  - focusing detection ultrasonic acoustic waves emitted by the actuators via the detection surface into a focusing region belonging to a plane located opposite the detection surface, by applying on the actuator control signals calculated by the electronic and/or IT computer from a measurement of an audio impulse response and/or a vibratory impulse response of the detection surface, generated by an emission of ultrasonic calibration acoustic waves by each of the actuators, and the application of a first time reversal method to the audio impulse response and/or to the vibratory impulse response of the detection surface, then
  - measuring a duration between the emission of the detection ultrasonic acoustic waves and a reception of an echo of the detection ultrasonic acoustic waves by the ultrasonic acoustic wave detector;
  - wherein the electronic and/or IT computer is configured to calculate the control signals such that the detection ultrasonic acoustic waves are focused successively into focusing regions with different shape and/or dimensions.

This device suggests carrying out a detection of one or more element(s) based on the use of the acoustic focusing obtained thanks to the time reversal principle applied to ultrasonic acoustic waves (wavelengths comprised between 16 kHz and 10 MHz) emitted from a detection surface, planar or not, in order to locate the element(s), for example at least one finger or one hand of a user, in the space located in front of this detection surface.

The determination of the position of the element(s) is based on the measurement of the time required for focused acoustic waves to be emitted and then return in the form of an echo. The estimation of the position of the element(s) is carried out in three dimensions thanks to the echo of the focused waves which allows defining the presence of the element or one of the elements to be detected in the focusing region which belongs to a two-dimensional plane, and to the measurement of the delay between the emission of the waves and the reception of the echo which allows determining the distance between the detected element and the ultrasonic acoustic wave detector which is advantageously in the same plane as that in which the detection surface is located.

Thanks to focusing of the ultrasonic acoustic waves carried out in several different focusing regions, several fingers could be detected independently.

Afterwards, this localisation may allow enriching the modes of interaction with the device, without contact with the latter.

By appropriately selecting the characteristics (dimensions and/or shapes) of the successive focusing regions of the ultrasonic acoustic waves, it is possible to considerably reduce the acquisition time by appropriately traversing different regions of the space in which the element(s) to be detected is/are located, for example by varying the size of the focusing regions and the distance reached by the focused ultrasonic acoustic waves, and by carrying out a dynamic target tracking.

By "focusing point", it should be understood the point where the ultrasonic acoustic waves are focused and converge.

The detection carried out by the device may be static because it does not involve any comparison of the signals between two distinct time points. It may also be quasi-static (small movement of the element(s) to be detected) or dynamic.

Advantageously, this device may be used to increase the capabilities of interactive systems by going beyond tactile interaction, to enable a gestural and contactless interaction.

Advantageously, the device may be used to carry out a detection of several fingers of a user.

This device may enable a real-time interaction of a user.

This device is not sensitive to the optical conditions of use and is robust with regards to electrical disturbances.

This device is capable of carrying out a detection at a large distance, for example up to about 1 metre from the detection surface.

This device further has the advantage of being able to operate with a low electronic or IT computing capacity because it does not use an image processing method to identify the element(s) to be detected. This device directly recovers the position of the closest object(s) that have returned an echo of the ultrasonic acoustic waves.

This device also has the advantage of preserving privacy, thanks to the fact that it does not capture images, that it operates at ultrasonic frequencies and that the acquired data are processed locally.

Advantageously, this device may be used for a low dynamic multi-finger interaction. Indeed, the device generates virtual audio sources thanks to the performed focusing of the ultrasonic acoustic waves. The number of generated virtual ultrasonic sources may be large, which increases the accuracy of locating the elements to be detected. In addition, thanks to the performed focusing, the energy of all actuators is found concentrated in the focusing region, which increases the amplitude of the reflected signal (echo) and therefore simplifies the detection. By focusing the waves into the focusing region, this allows isolating the studied region with regards to all parasitic reflections whose amplitude will be much lower. Hence, the detection carried out by the device in the focusing region is not disturbed by elements external to this region.

For example, each finger may be detected independently. In addition, even though these fingers are static, the device knows the position of the region at which the focusing is carried out. If it receives a response, it associates an accurate position of the detected finger. The distance from the finger may be measured even more accurately by measuring the time between the emission of the detection ultrasonic acoustic waves and the reception of the echo of these waves.

Focusing the ultrasonic sound waves from multiple piezoelectric actuators increases the amplitude of the received echo, thereby facilitating the detection of this echo and distinguishing that echo from any possible parasitic echoes.

Hence, this device forms an easily integrated and inexpensive solution allowing interaction with a large workspace.

Advantageously, the possible applications of such a device relate to interfaces of the human-machine type interfaces, or HMI, like for example interactive screens operating without contact, dashboards in vehicles, switches in the building sector, or interactive tables. The device may also be used for contactless interactions with IT devices, tablets or smartphones. The possible functions that can be implemented by the device are, for example, the manipulation of virtual 3D objects, the use of contactless interactive screens (which is advantageous from the health/hygiene perspective), or the interaction with a dashboard in a small space.

This device may also be used for other types of applications, like for example in the industrial fields of 3D localisation of objects for robotic control or part geometry control, or for system applications such as those of reversing radars for vehicles or the adjustment of the orientation of a vehicle with respect to targets.

For example, this device may allow a simple, compact and inexpensive integration of control buttons in a dashboard of a vehicle or of musical equipment. The proposed device allows integrating a large number of buttons and virtual dimmers in a reduced and reconfigurable space forming an interaction volume in front of the dashboard.

The device may allow adding perceptual functions to a robot, in the case of difficult environments (for example low or barely controlled luminosity, or observation of barely textured or transparent objects, or presence of numerous obstructions).

The element(s) detected by the device may be of any shape and made of any material that does not absorb ultrasonic acoustic waves.

In the field of mobile telephones and IT, it is possible to use the contactless detection device to add an interaction dimension, to facilitate 3D manipulation, or to enable interactions by gestures of the user. Examples of applications of the device include:
  interacting with an application in the background (for example music, camera) or activating brief functions (e.g. flashlight, volume);
  interacting with the usual user interface but without contact (for example when the hands are wet or dirty, or when the device is not within reach of the user);
  enhancing the functions of interaction with the applications (for example the functions of zooming, rotation, inclination, translation of an image, the functions of dragging or dropping of files, the functions of copying or pasting a text, etc.);
  enhancing the interactivity of video games.

A smartphone or an IT device equipped with such a device may also be directly used as a 3D measurement system during a virtual or augmented reality activity, to scan 3D objects, or any other 3D imaging application.

In the automotive field, the device may be used to replace the buttons and the touchscreens or to enable interaction by gestures. The interaction device may be integrated directly into the dashboard of a vehicle.

In the field of industrial robotics, this device may be used to enable an industrial robot arm to 3D scan its approach area as close as possible to obstacles (sensor placed on the effector) while avoiding obstructions if the sensor is centralised.

In the field of construction/agricultural machinery, this device could allow improving the functionalities of a reversing/approach radar to take into account the context surrounding the machinery (geometry of the approached objects for better positioning).

The implemented calibration, which enables the calculation of the control signals of the actuators to emit the detection ultrasonic acoustic waves, may be done in several ways:
  measurement, proximate to or at some distance from the detection surface, of the audio impulse response generated by the emission of the calibration ultrasonic acoustic waves, then application of the first time reversal method to this measured audio impulse response, and/or
  measurement of the vibratory impulse response of the detection surface generated by the emission of the calibration ultrasonic acoustic waves, then application of the first time reversal method to this measured vibratory impulse response.

The more proximate to the detection surface the audio impulse response is measured, the more accurately the radiant portion of the calibration ultrasonic acoustic waves is measured (which generates less loss of information), and the more accurate the performed focusing of the detection ultrasonic acoustic waves afterwards will be.

The vibratory impulse response of the detection surface may be measured by a vibrometer, for example a laser vibrometer.

The actuators may correspond to piezoelectric actuators. Alternatively, the actuators may be of a type other than piezoelectric if they have a broadband frequency response, like for example electrostatic.

The detection surface may correspond to a first face of a material plate, and the actuators may be secured to a second face, opposite to the first face, of the material plate. Such a configuration allows facilitating the integration of the detection device, the actuators being secured behind the surface to be instrumented.

The plate forming the detection surface may include glass and/or plastic and/or metal. The material(s) of the plate may be transparent, or not. The plate may be planar, or not, for example curved.

The material plate may have a thickness comprised between 0.1 mm and 3 mm and/or may include a material whose Young's modulus is comprised between 50 GPa and 300 GPa, and/or may be such that a ratio of its volumetric mass to the Young's modulus of the plate material is comprised between $20.10^{-8}$ kg/m·N and $50.10^{-8}$ kg/m·N. In particular, such characteristics allow guaranteeing a good transmission of the ultrasonic acoustic waves by the plate towards the air.

The ultrasonic acoustic wave detector may include at least one microphone and/or acoustic transducers disposed over the detection surface. The acoustic transducers may correspond to piezoelectric actuators distinct from the actuators configured to emit the detection ultrasonic acoustic waves.

Alternatively, the ultrasonic acoustic wave detector may be formed by the actuators, for example piezoelectric, configured to emit the ultrasonic acoustic waves and which are able to also carry out an acoustic transduction. This variant is advantageous because it allows for a very good integration of the device.

Furthermore, in this variant, the electronic and/or IT computer may be configured to apply a second time reversal method to the echo of the detection ultrasonic acoustic waves received by each of the actuators. In this case, the element to be detected on which the focused wave is reflected is likened to a sound source. The computer having knowledge of the signal emitted by this virtual source as well as the impulse response relating the vibrations in the plate to all points of the observable volume may therefore locate the virtual source by measuring the vibrations in the plate and by applying the principle of time reversal. The application of this second time reversal method allows adding location information to the data on the presence or absence of a reflector in the focusing area. Advantageously, this variant may be used when the size of the acoustic focal spot, i.e. the area where the acoustic waves meet, is large during a preliminary detection, which allows selecting the future detection area in which the acoustic waves will be focused in a more relevant manner. Hence, this allows improving the localisation accuracy and the speed of detection of the device.

The actuators may be configured to emit ultrasonic acoustic waves whose frequencies are comprised between 20 kHz and 100 kHz. This range of values is far enough from the range of frequencies audible to humans, which allows avoiding inconvenience for the user of the device.

The electronic and/or IT computer may be configured to measure a frequency shift between the emitted detection ultrasonic acoustic waves and the echo of the detection ultrasonic acoustic waves, and calculate a speed of movement of the detected element(s) from the measured frequency shift. This speed is obtained according to the direction between the detected element(s) and the ultrasonic acoustic wave detector using the principle of the Doppler effect.

The electronic and/or IT computer may be configured to encode the control signals prior to the emission of the ultrasonic acoustic waves. This encoding may be carried out so that the focused wave has a known frequency content, a discrete phase or frequency variation, or a frequency modulation. In this case, the detection device is more robust thanks to the decoding of the waves resulting from the echo, which enable it to ensure that this signal is well correlated with the emitted signal and that it does not result from an ambient noise.

The invention also relates to a contactless interaction device, including at least one contactless detection device as described before, and configured to carry out one or more action(s) according to a result of the detection carried out by the contactless detection device.

The contactless interaction device may form a human-machine interface comprising a display surface to which the detection surface of the contactless detection device is secured.

The invention also relates a method for controlling a contactless detection device as described before, including the implementation of the following steps:
  calculating, by the electronic and/or IT computer, the control signals from a measurement of an audio impulse response and/or a vibratory impulse response of the detection surface, generated by an emission of the calibration ultrasonic acoustic waves emitted by each of the actuators, and the application of a first time reversal method to the audio impulse response and/or to the vibratory impulse response of the detection surface, then
  applying the calculated control signals on the piezoelectric actuators, focusing the detection ultrasonic acoustic waves emitted by the piezoelectric actuators into a focusing region belonging to a plane opposite the detection surface, then
  measuring a duration between the emission of the detection ultrasonic acoustic waves and a reception of an echo of the detection ultrasonic acoustic waves by the ultrasonic acoustic wave detector;
  and wherein these steps are repeated several times such that the calculated control signals focus the detection ultrasonic acoustic waves successively into focusing regions with different shape and/or dimensions.

The method may further include a calibration of the contactless detection device comprising the implementation of the following steps:
  emitting calibration ultrasonic acoustic waves by each of the piezoelectric actuators;
  measuring an audio impulse response and/or a vibratory impulse response of the detection surface generated by the emission of calibration ultrasonic acoustic waves;
  applying the first time reversal method to the audio impulse response and/or to the vibratory impulse response of the detection surface;
  memorising the signals obtained by applying the first time reversal method to the audio impulse response and/or to the vibratory impulse response of the detection surface.

Advantageously, the method may be implemented to detect a position or a movement of one or more finger(s) of a user of the detection device.

BRIEF DESCRIPTION OF THE DRAWINGS

The present invention will be better understood upon reading the description of exemplary embodiments given purely for indicative and non-limiting purposes with reference to the appended drawings wherein.

Identical, similar or equivalent portions of the different figures described hereinafter bear the same reference numerals so as to facilitate passage from one figure to another.

Figure 1:
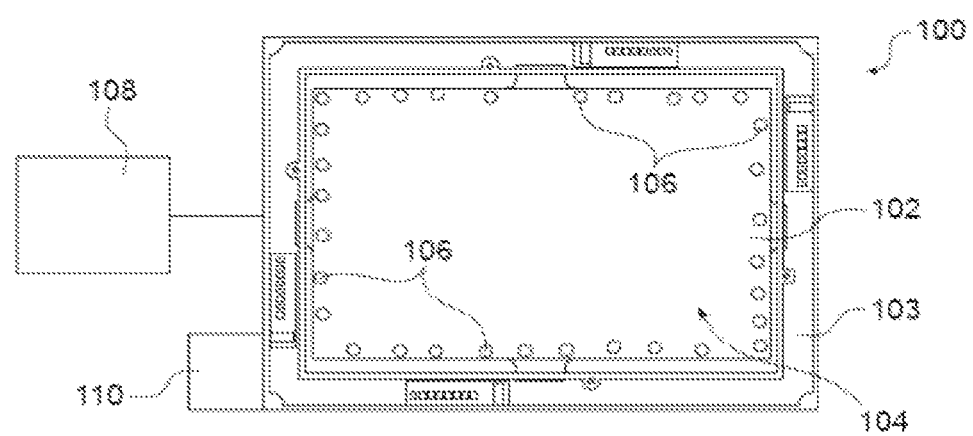
FIG. 1 schematically represents a contactless detection device according to a particular embodiment.

The different portions represented in the figures are not necessarily plotted according to a uniform scale, to make the figures more readable.

The different possibilities (variants and embodiments) should be understood as not exclusive of one another and could be combined together.

DETAILED DISCLOSURE OF PARTICULAR EMBODIMENTS

A contactless detection device 100 according to a particular embodiment is described hereinbelow with reference to FIG. 1.

The device 100 includes a material plate 102, a first face 104 of which forms a detection surface of the device 100. For example, the plate 102 includes glass, plastic or metal. For example, the plate 102 has a thickness comprised between 0.1 mm and 3 mm and/or includes a material whose Young's modulus is comprised between 50 GPa and 300 GPa and/or is such that a ratio of its volumetric mass to the Young's modulus of the material of the plate 102 is comprised between $20.10^{-8}$ kg/m·N and $50.10^{-8}$ kg/m·N.

The plate 102 is herein fastened to a frame 103. When the device 100 is intended to be fitted on the front face of a screen, the plate 102 may include a transparent material so that the screen remains visible therethrough, when the piezoelectric actuators 106 described later on are disposed at the periphery of the plate 102.

According to a particular embodiment, the dimensions of the plate 102 are for example equal to 156 mm×76 mm, with a thickness equal to 0.5 mm.

The plate 102 may be planar or not, for example curved.

The device 100 also includes several actuators 106 acoustically coupled to the detection surface and configured to emit ultrasonic acoustic waves. Advantageously, the actuators 106 correspond to piezoelectric actuators. Alternatively, the actuators 106 may be of the electrostatic type.

In the particular embodiment described herein, the actuators 106 are secured, for example by gluing, to a second face, opposite to the first face 104, of the plate 102. Furthermore, in the particular embodiment described herein, the actuators 106 are secured to the plate 102 proximate to the edges thereof. Alternatively, the actuators 106 may be disposed at any point of the second face of the plate 102. In another variant, the actuators 106 may be disposed on the side of the first face 104 of the plate 102, i.e. on the side of the detection surface.

According to one embodiment, each piezoelectric actuator 106 includes a piezoelectric material portion, for example PZT, disposed between at least two control electrodes allowing applying a potential difference on the piezoelectric material portion. For example, each piezoelectric actuator 106 may include a PZT portion made in the form of a lamella with dimensions equal to 70 mm×10 mm×0.2 mm, to which are coupled 16 electrodes intended to actuate this PZT lamella.

In general, the number of first actuators 106 acoustically coupled to the detection surface of the device 100 is for example comprised between 1 and 32, and possibly more depending on the actuation electronics of the device 100. The greater the number and dimensions of the actuators 106, the higher the power of the signal emitted by the device 100, and the better the obtained focusing resolution.

The piezoelectric actuators 106 are configured to emit ultrasonic acoustic waves whose frequencies are advantageously comprised between 20 kHz and 100 kHz.

The device 100 also includes an electronic and/or IT computer 108, represented symbolically in FIG. 1 by a rectangle bearing the reference 108. One of the functions of this computer 108 is to calculate control signals intended to be applied on the piezoelectric actuators 106.

The device 100 also includes an ultrasonic acoustic wave detector 110. This detector 110 is intended to capture the echo of the ultrasonic acoustic waves which will be emitted by the piezoelectric actuators 106 through the plate 102. In the particular embodiment described herein, the detector 110 includes at least one microphone disposed proximate to the plate 102.

Alternatively, the detector 110 may correspond to additional piezoelectric actuators separate from the actuators 106 and disposed over the detection surface of the device 100, on the side of the first face 104 of the plate 102 or of the second face opposite to the first face 104. According to another variant, the detector 110 may be formed by the piezoelectric actuators 106 which ensure both the emission of the ultrasonic acoustic waves and the reception of the echo of these waves.

The operating principle of device 100 is described hereinbelow with reference to FIG. 2.

Prior to the detection of one or more element(s) by the device 100, a calibration of the device 100 is implemented.

For this calibration, according to a first embodiment, a device 150 for measuring ultrasonic acoustic waves is disposed at a non-zero distance from the detection surface of the device 100. For example, the plane in which the device 150 is located during the calibration is spaced from the detection surface by a distance comprised between 0 and 50 cm.

Afterwards, an emission of calibration ultrasonic acoustic waves is carried out by each of the actuators 106. For example, these calibration ultrasonic acoustic waves correspond to periodic signals, or pseudo-periodic signals whose instantaneous frequency varies in at least one portion of the range of frequencies used for the operation of the device 100. These signals are commonly called "chirp". The reference 152 designates an example of a pseudo-periodic control signal applied on the control electrodes of one of the piezoelectric actuators 106.

The calibration ultrasonic acoustic wave emitted by each of the piezoelectric actuators 106, propagated and reflected in the plate 102, is measured by the device 150. In FIG. 2, the reference 154 symbolically designates one of the calibration ultrasonic acoustic waves measured by the device 150. Each of the acoustic waves measured at one point, derived from the emission of each of the piezoelectric actuators 106, are recorded as calibration data of this point.

Afterwards, a time reversal method is applied on each of the calibration ultrasonic acoustic waves measured by the device 150. The signals obtained after the application of this method correspond to the waves intended to be emitted by each of the piezoelectric actuators 106 to obtain focusing of these waves at the focusing point corresponding to the location of the device 150. In FIG. 2, the reference 156 symbolically designates the signals obtained after application of the time reversal method. Details of implementation of the time reversal method are for example described in the document by Fink M., "Time Reversal of Ultrasonic Fields—Part I: Basic Principles", IEEE Transactions on Ultrasonics, Ferroelectrics, and Frequency Control, vol. 39, No. 5, pages 555-566, September 1992.

Afterwards, this time reversal calibration method is repeated for a large number of locations of the device 150 opposite the plate 102. For example, in the variant shown in FIG. 2, this calibration is repeated so that the locations of the device 150 form a meshing covering the entire surface of the first face 104 and having a 10 mm spacing between two neighbouring locations of the device. 150.

Afterwards, the signals obtained after application of the time reversal method on each of the calibration ultrasonic acoustic waves measured by the device 150 are recorded in a memory or a database of the device 100, forming for example part of the computer 108.

According to a second embodiment, this calibration may be carried out not by measuring the audio impulse response generated by the emission of the calibration ultrasonic acoustic waves, but by measuring the vibratory impulse response on the detection surface generated by the emission of the calibration ultrasonic acoustic waves. In this case, the device 150 is replaced by a vibrometer, for example of the laser type, disposed against the plate 102 and which allows measuring this vibratory impulse response.

Upon completion of this calibration phase, the device 100 is used to carry out a detection of one or more element(s) seeking for example to interact with the device 100.

For this purpose, the actuators 106 are controlled to simultaneously emit detection ultrasonic acoustic waves focused into a region of the space in which the presence of the element(s) seeking to interact with the device 100 is sought. The control signals allowing obtaining focusing of the ultrasonic acoustic waves into the desired focusing region are calculated by the computer 108 by applying a transformation and a filtering to the signals previously recorded at the end of the calibration phase. In FIG. 2, the reference 158 symbolically designates the calculated control signals which allow obtaining a focusing of the ultrasonic acoustic waves into a desired focusing point designated by the reference 160.

The signal emitted and focused by the actuators 106 is selected so as to excite only ultrasonic frequencies, for example filtering frequencies below 20 kHz. It is possible to carry out, on emission, a filtering of the emitted waves.

Filtering of the signals before emission thereof fulfils several functions. The first one is to adapt recorded vibration signals to the surface of the plate 102 during calibration, so that focusing occurs at a selected distance with respect to the surface of the plate 102. For example, the completed calculations are for example derived from solving of Kirchhoff-Helmholtz integral, to which simplifications could be made. This integral determines the acoustic pressure at a point of the volume when the acoustic pressure and the speed of movement are known at all points of the plate 102. It also assumes that the environment in which the device 100 operates contains no acoustic source other than the plate 102, in which case the performances of the system will be reduced. Additional assumptions made to solve the integral are that the boundary conditions of plate 102 are known. The edges of the plate 102 are rigidly or flexibly embedded. In these two cases, the computer 108 can solve a simple integral involving all of the signals recorded during the calibration of an emitter. Thus, the computer 108 allows determining the theoretical impulse response between this emitter and the point of the studied volume. By reversing this theoretical signal in time and by carrying out this procedure for all emitters, the signals to be emitted to focus an acoustic wave at this point are known. All these calculations may be carried out in real-time before emission, or may be pre-recorded following the calibration phase. Details relating to this procedure could be found in the document by Nicolas Etaix, "Imagerie acoustique a faible nombre de transducteurs au moyen d'une cavite acoustique". Acoustics [physics.class-ph]. Paris-Diderot University—Paris VII, 2012, Chapter II: Plate acoustic radiation and focusing.

The second role of the filtering is to limit the frequencies emitted by the device 100 in a selected frequency band: they must remain in the ultrasonic domain, and a high-pass filtering could therefore be carried out for this purpose. The selected frequency band must also allow adjusting the size of the acoustic focal spot formed by the emitted waves. Hence, a low-pass filtering may also be carried out such that the high frequencies are eliminated in order to widen the acoustic focal spot.

The third role of filtering may consist in adding a frequency or phase encoding, so that the measured echoes could be well correlated with the emitted signals.

By carrying out such a focusing, the energy of the waves emitted by the actuators 106 accumulates in the focusing region, which allows obtaining a more powerful signal in this region.

Figure 3:
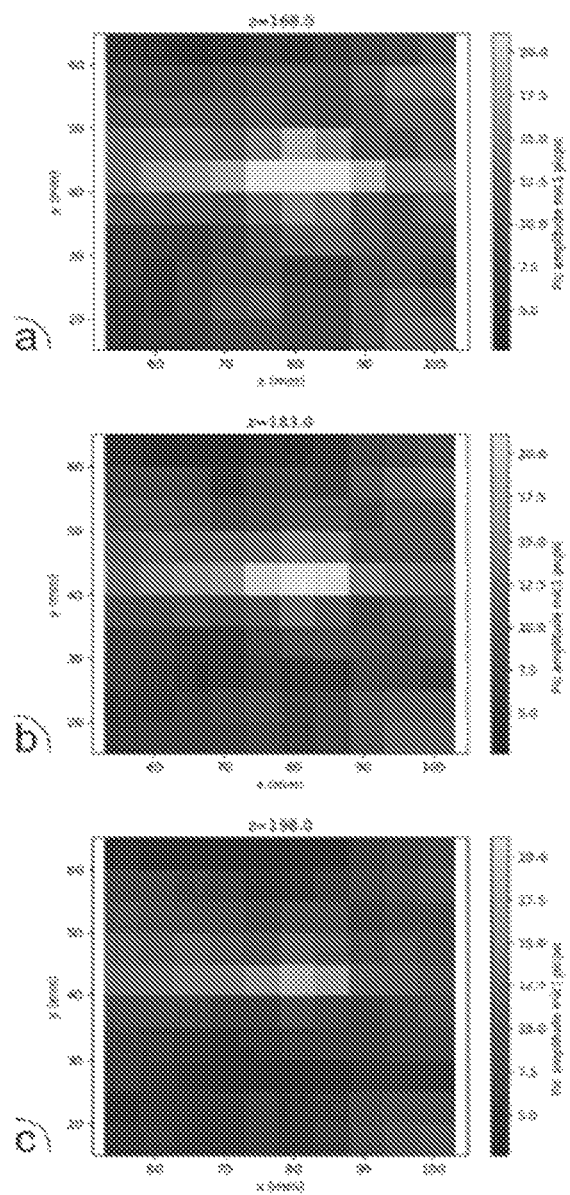
FIG. 3 represents the spatial distribution of the focusing obtained at different distances from the detection surface of the contactless detection device, for the same emission of acoustic waves focused at the same focusing point.

FIG. 3 represents the spatial distribution of the focusing obtained at different distances from the detection surface for the same emission of acoustic waves focused at a focusing point located at a distance from the detection surface equal to 183 mm. In the three diagrams of this FIG. 3, the power of the focused waves obtained in a plane parallel to the detection surface, as a function of the position in this plane, is represented. In the diagram a), the considered plane is at a distance of 168 mm, whereas in the diagram b), the considered plane is at a distance of 183 mm (equal to the distance between the detection surface and the focusing point), and that in the diagram c), the considered plane is at a distance of 198 mm.

Figure 2:
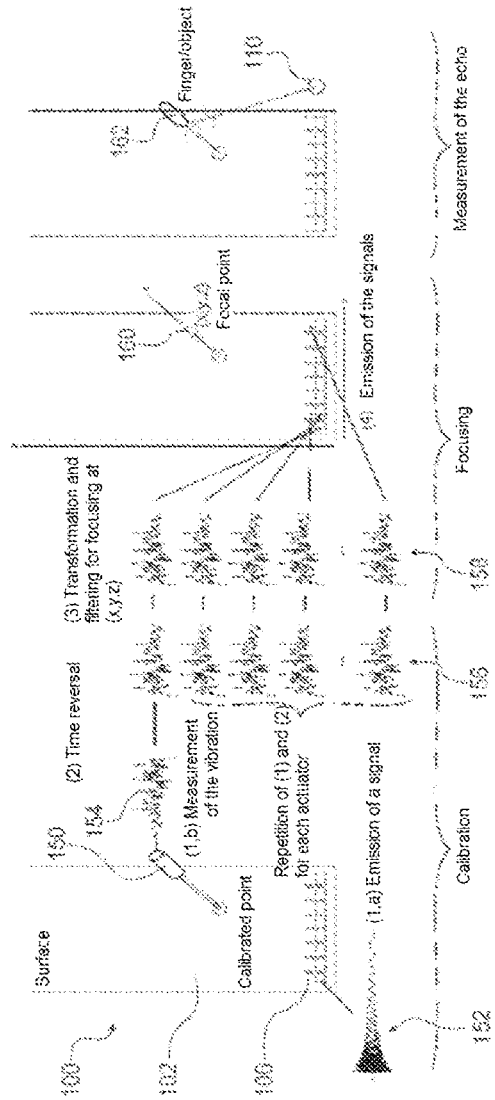
FIG. 2 schematically represents the operating principle of the contactless detection device according to the particular embodiment.

If the emitted ultrasonic acoustic waves encounter an element, designated by the reference 162 in FIG. 2, these waves are then reflected in the form of an echo. This echo is detected by the detection means 110 of the device 100. The device 100 then carries out a measurement of a duration between the emission of the ultrasonic acoustic waves and the reception of the echo of these ultrasonic acoustic waves by the detector 110, which allows determining the distance between the device 100 and the detected element.

Figure 4:
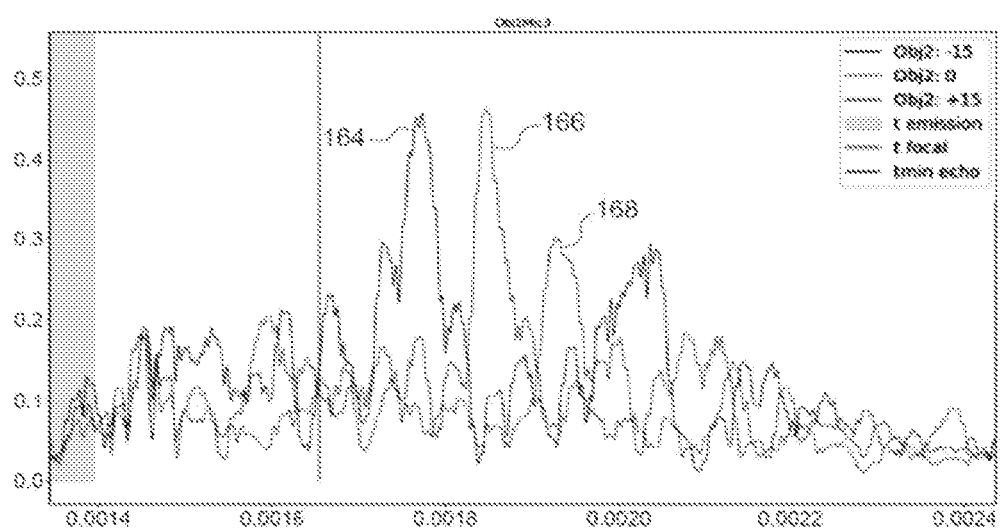
FIG. 4 represents several echoes of ultrasonic acoustic waves obtained for the same wave emission, when these waves are reflected by objects located at different distances.

FIG. 4 represents several echoes of ultrasonic acoustic waves obtained for the same wave emission, when these waves are reflected by objects located at different distances. The curve 164 corresponds to the echo measured for waves emitted and focused at a focusing point 200 mm away from the detection surface, and reflected on an object placed at 185 mm from the detection surface. The curve 166 corresponds to the echo measured for waves emitted and focused at a focusing point 200 mm away from the detection surface, and reflected on an object placed at 200 mm from the detection surface. The curve 168 corresponds to the echo measured for waves emitted and focused at a focusing point 200 mm away from the detection surface, and reflected on an object placed at 215 mm from the detection surface.

In order to reduce the time for measuring the position of the element(s) to be detected, the computer 108 is configured to calculate the control signals such that the ultrasonic acoustic waves emitted by the piezoelectric actuators 106 are focused successively into regions with shape different and/or or sizes. Thus, the dimensions and/or the shape of the regions in which the ultrasonic acoustic waves are successively focused are appropriately adjusted in order to reduce the time necessary for the detection of the element(s) to be detected.

For example, it is possible to start the detection of the element(s) to be detected with a rough view of the environment, i.e. by defining a relatively wide first focusing region, then carrying out focusing of the emitted acoustic waves into one or more region(s), for example with smaller dimensions, to increase the spatial resolution of the measurement made by the device 100 and thus accurately determine the position of the element(s) to be detected. This does not require an additional calibration, but a different filtering on the emitted signals in order to calculate different control signals. Afterwards, the device 100 may carry out wave emissions focused into regions with small dimensions, around the measured points. Having determined beforehand the distance between the detection surface and the detected element through the measurement of the duration of reception of the echo of the waves, the next focusing regions may be selected at a distance, with respect to the detection surface, equal to that between the detected object and the detection surface. This allows limiting the reception of parasitic echoes.

In order to improve the speed of detection of the elements, the device 100 may be capable of selecting the relevant observation areas and adjust its field of observation according to the selected areas. Technically, the modification of the field of observation may be obtained by enlarging more or less the size of the acoustic focal spot, i.e. by extending more or less the area where the acoustic waves meet. This is achieved by filtering the high frequencies of the signal emitted by each actuator 106. Indeed, the less the emitted signal comprises high frequencies, the more the obtained acoustic focal spot is extended. Thus, should an element be located away from the centre of the focal spot, it will return an echo, indicating to the device 100 that it is necessary to deepen this search area. In this case, the spot will have the shape of an ellipsoid the diameter of the horizontal section of which is variable. By dichotomy, by varying the size of the ellipsoid, the device 100 could determine the accurate position of the detected element.

To have a first image of the elements present in the observed scene, the device 100 may emit detection waves such that they form several large-diameter ellipsoids, at several altitudes. Since the distance of the element with respect to the detection surface could anyway be accurately determined thanks to the time-of-flight, this determination is faster if the focal spot is more elongated, such as a beam. It turns out that the technology does not allow controlling the elongation of these ellipsoids. Nevertheless, it is possible to control the distance of the bottom of this geometry with respect to the emission surface, and therefore maximising the acoustic energy focused above this point.

The selected dimensions of the focal spots depend on the size of the space to be scanned, the spatial accuracy to be achieved, as well as the desired response time of the device 100. The diameter at half intensity height of a focal spot tends towards the acoustic half-wavelength. This means that the frequency used by the emission signals directly impacts the size of the focal spot. For example, this corresponds, in air, to a frequency of 40 kHz at a focal spot with a 4 mm diameter. Nevertheless, this dimension also increases with the distance of the focusing point with respect to the detection surface, which effect is compensated by the equivalent emission aperture of the device 100. This aperture corresponds to the dimensions of the plate 102 to which is added a correction related to the quality of the reflections in the plate 102 and the number of actuators 106. Thus, for a of 150×150 mm$^2$ plate 102, the detection resolution at 50 cm is theoretically 14 mm, this resolution being possibly improved by the embedding conditions and the number of actuators 106 of the device 100.

On the other hand, the selection of the frequency with which detections are carried out for large focusing regions depends on the application. If the action performed during the interaction requires only one finger, the device 100 may be configured to decide to track only that detected finger without proceeding with detections in large focusing regions.

An algorithmic work may be implemented to select the optimum area to be scanned.

When the device 100 is configured to carry out a detection of one or more moving element(s), the device 100 may be configured to measure at least one frequency shift between the emitted detection acoustic waves and the echo of these waves, and calculate a speed of movement of the detected element(s) from the measured frequency shift. Thus, thanks to the measurement of the Doppler effect (corresponding to the measured frequency shift), it is possible to determine the speed of movement of the detected element(s). Afterwards, it is possible to determine other information relating to the movement of the detected element(s), such as predicting its future distance, with respect to the detection surface, after a given duration and anticipating the positions of the focusing points at which the ultrasonic acoustic waves will be focused during the next detections. Parallel to these movement tracking phases, the device 100 can focus the ultrasonic acoustic waves in wide focusing regions, for example in order to detect the apparition of new elements seeking to interact with the device 100.

On the other hand, the geometry of the focusing region may also be modified. For example, it is possible to generate a kind of ray that allow detecting an object over a large altitude range, without having to scan each separate altitude.

To improve the robustness of observation and measurement of the echoes, the focused ultrasonic acoustic waves may be encoded. This encoding may be achieved by alternating the phase of the signals and/or the frequency content of the control signals applied on the first piezoelectric actuators 106. Indeed, even though the focusing of the waves made by the device 100 allows avoiding the completed detection being disturbed by obstacles that are more distant or located outside the considered focusing region, it is possible that part of the emitted ultrasonic acoustic waves are detected with some delay by the detector 110, after reflection of these waves off of the focusing point. The encoding of the emitted ultrasonic acoustic waves allows ensuring, by comparing whether the received echo includes the same encoding as that applied upon emission, that the echoes captured by the detection means actually correspond to the initially emitted waves.

In a variant of the device 100, the piezoelectric actuators 106 may be used to cancel or attenuate the residual vibrations of the plate 102, in order to accelerate the detection method, or to increase the signal-to-noise ratio of the measurement. Indeed, the vibrations in the plate 102 continue after the emission of the focusing signal, following numerous reflections occurring before the waves end up attenuating naturally. This involuntary lengthening of the emitted signal also leads to a lengthening of the received echo signal, and requires waiting for the complete system to be stabilised before generating a new pulse or accepting a loss of signal quality. Thus, this attenuation of the vibrations of the plate 102 avoids the new reception being interfered with by the previous one.

In order to have a brief and controlled emission, it is possible to actively attenuate the residual vibrations. Indeed, thanks to the calibration, the response of the plate 102 following the emission of the focusing signals is known. Since the actuators 106 cover a large surface covered by these waves, it is possible to control them with a signal with an amplitude opposite to the residual vibration signal, which is known at each position thereof. These active attenuation signals may be applied directly following the focusing signals by time reversal.

According to another variant, these residual vibrations may be eliminated digitally thanks to the fact that they are known, because they are due to the emission of calculated ultrasonic acoustic waves. Their effect at the focusing point is calculated digitally. Indeed, the residual vibration of the plate 102 being known following the calibration, it is possible to calculate the acoustic field that they generate in the volume. Knowing this signal, if an object has been detected in the focusing area, it is possible to directly suppress this signal in the acoustic measurement that will follow the next focusing. Thus, it is possible to carry out a detection at a new point before the echo of the previous measurement is completely attenuated and without this disturbing the measurement.

These variants allow recovering an echo of the ultrasonic acoustic waves which is not or barely disturbed by these residual vibrations.

According to one variant, when the used detection means 110 correspond to the piezoelectric actuators 106, it is possible to apply a second time reversal method to the received waves, which allows improving the accuracy of localisation of the detected element(s). Indeed, the element to be detected on which the focused wave is reflected is likened to a sound source. The computer 108 having knowledge of the signal emitted by this virtual source as well as the impulse response relating the vibrations in the plate 102 to all points of the observable volume, could, by measuring the vibrations in the plate 102 and by applying the time reversal principle, locate the virtual source. The application of this second time reversal method allows adding location information to the data on the presence or absence of a reflector in the focusing area. This could advantageously be used when the size of the focal spot is large during a preliminary detection and thus allows selecting the future focusing region more appropriately. Hence, this could improve the localisation accuracy and the detection speed of the device 100.

According to another variant, complementarily to all these acoustic localisation techniques, the electrodes of the piezoelectric actuators 106 may be used as mutual capacitive sensors. In this case, disturbances of the electric field close to the detection surface may be measured and associated with the presence of an element to be detected. Advantageously, this increases the near-field interaction accuracy of the device 100.

In this other variant, the upper electrodes of the piezoelectric actuators 106 glued to the detection surface may be connected to an electronic capacitive measuring system, for example formed by the computer 108. The latter can measure the capacitance formed by the upper electrodes of two adjacent actuators 106. When an object whose electrical permittivity is different from that of air is present, the latter deforms the electric field lines, and therefore the mutual capacitance between these electrodes. For example, in the presence of a finger, which has a higher permittivity than air, this mutual capacitance increases. This increase in the mutual capacitance depends on the size of the finger and its distance from the detection surface, but by using several pairs of electrodes, it is possible to find this information and thus accurately locate the finger, both in distance with respect to the detection surface and in the plane in which it is located. This technique can improve the interaction accuracy near the surface, but also when the object touches the surface because in this case, the time reversal no longer applies because the object attenuates the focusing waves and there is no echo. Nevertheless, the accuracy decreases very rapidly with the distance (a few cm) while this is not the case in acoustics (up to a few dm). This variant has the advantage of using a single system for exploiting several complementary physical principles in order to carry out an interaction detection.

For all of the above-described variants and embodiments, the physical principle of ultrasonic acoustic detection used by the device 100 does not require any particular specificity to form the detection surface. However, some parameters could improve the detection performances, and a trade-off on these parameters could allow maximising the obtained focusing contrast, focusing resolution and amplitude of the echo signal. These parameters of the plate 102 forming the detection surface are: the mass per unit area $\rho_s$ and the Young's modulus Y associated with the Poisson's ratio v of the material of the plate 102, the thickness e of the plate 102 and the detection surface S, the number Q of actuators 106, the used frequency bandwidth B, the minimum frequency of the signals f and the emission time T of the signals.

A first element to consider is the coincidence frequency $f_c$. This corresponds to the fact that the acoustic wavelength in the plate 102 is equal to that of the air. At this frequency and slightly above, the plate-air coupling is maximised, which allows obtaining a maximum radiation from the plate 102 and therefore increasing the amplitude and the richness of the emitted signals to have an ideal focusing. This frequency may be selected at 20 kHz, to have a good coupling up to 100 kHz. This coincidence frequency is expressed by the following formula:

$$f_c = \frac{1}{2\pi} \cdot c_0^2 \cdot \sqrt{\frac{12.\rho_S.(1-v^2)}{Y.e^3}},$$

with $c_0$ the speed of sound in air. Y, v and $\rho_s$ relating to the material of the plate 102, the adjustment of the thickness e of the plate 102 is privileged to define a plate stiffness $$D = \frac{Y.e^3}{12.(1-v^2)},$$

such that $$f_c = \frac{1}{2.\pi} \cdot c_0^2 \cdot \sqrt{\frac{\rho_S}{D}}$$

when e, therefore D, is increased, the low-frequency coupling of the plate 102 is improved. But it is necessary to avoid $f_c$ being too low to avoid radiation in the audible range.

For a good focusing contrast $C_{ideal}$, it is preferable to have many vibration modes in the used frequency band, which are related to the stiffness, to the frequencies and to the surface of the plate 102. This focusing contrast is expressed by the relationship $$C_{ideal}^2 = B \cdot \frac{S}{2} \cdot \sqrt{\frac{D}{\rho_s}}.$$

Thus, by increasing the stiffness, the surface of the plate 102 and the bandwidth of the emitted signal, an ideal contrast is obtained.

Nevertheless, that supposes that the product Q·T is large compared to $$\frac{S}{2} \cdot \sqrt{\frac{S}{\rho_S}}$$

because if these quantities are close, C decreases. Yet, the emission time T is limited by the attenuation coefficient of the plate τ. Beyond an emission time equal to 3. τ, the increase in T no longer has any effect. In addition, a long emission time T decreases the speed of detection of the device 100. On the other hand, the number of usable actuators 106 is limited by the acquisition electronics.

Considering what is indicated hereinabove, it is preferable to have a plate 102 having a high stiffness, therefore a significant thickness. Nevertheless, the plate 102 should be able to continue to transmit plane waves. In addition, the stiffer the plate 102, the lower the amplitude of the vibrations, and the device 100 finds itself confronted with the effect of the ambient noise which reduces the signal-to-noise ratio. In the configuration where the plate 102 itself receives the echo, the plate 102 is not made such that it is too stiff for the echo to propagate again in the plate 102. Hence, a trade-off should be made on the stiffness of the plate 102.

Finally, it is preferable to avoid the material of the plate 102 being too viscous (as is for example the case of plastic) to avoid an excessive attenuation of the signals. The attenuation r should also not be too low, in which case the signals would continue to reverberate long after the emission. The attenuation is controlled by the type of boundary condition (i.e. rigid/free/simply supported) and the material that supports the plate 102. A rigid or free embedding reduces the attenuation.

For example, to meet the constraints disclosed hereinabove, the plate 102 may include glass, be disposed on foam and have the following parameters: e=0.7 mm, S=80×160 mm$^2$, Y=60 GPa, =0.24, $\rho_s$=1.62 kg·m$^{-2}$, T=2 ms, B=80 kHz, Q=32. With such parameters, it is possible to obtain focusing with the following characteristics: τ=1 ms, $C_{ideal}$=23 SI, C=22 SI, $f_c$=18 kHz.

Figure 5:
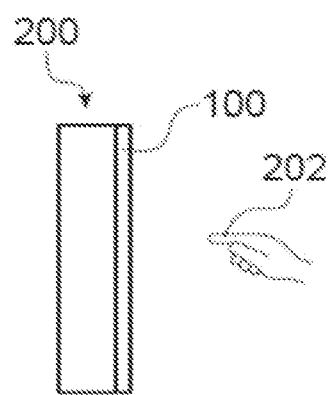
FIG. 5 represents a contactless interaction device according to a particular embodiment.

FIG. 5 schematically represents a contactless interaction device 200 including a contactless detection device 100. The device 200 is configured to carry out one or more action(s) according to a result of the detection carried out by the device 100. In the example of FIG. 5, the device 200 corresponds to a human-machine interface comprising a display surface, for example a screen, to which the detection surface of the device 100 is secured, and which is intended to interact with a hand (a finger 202 is represented in FIG. 5) of a user of the device 200. For example, depending on the gestures detected by the device 100, the device 200 may display information whose content depends on the detected gestures. According to another example, the device 200 may be used to carry out a manipulation of 3D virtual objects displayed on a screen of the device 200, these manipulations corresponding to the gestures detected by the device 100.

According to another embodiment, the device 200 may correspond to a robot to which perceptual functions are implemented via the detection device 100.

The invention claimed is:

1. A contactless detection device, comprising:
a detection surface;
a plurality of actuators acoustically coupled to the detection surface and configured to emit ultrasonic acoustic waves;
an ultrasonic acoustic wave detector; and
processing circuitry;
wherein the device is configured to perform detection of one or more elements by implementing the following steps a plurality of times:
focusing detection ultrasonic acoustic waves emitted by the plurality of actuators via the detection surface into a focusing region belonging to a plane located opposite and away from the detection surface, by applying on the plurality of actuators, control signals calculated by the processing circuitry from a measurement of an audio impulse response and/or a vibratory impulse response of the detection surface that was generated by an emission of ultrasonic calibration acoustic waves by each of the plurality of actuators, and application of a first time reversal method to the audio impulse response and/or to the vibratory impulse response of the detection surface, and
measuring a duration between the emission of the detection ultrasonic acoustic waves and a reception of an echo of the detection ultrasonic acoustic waves by the ultrasonic acoustic wave detector,
wherein the processing circuitry is further configured to calculate the control signals such that the detection ultrasonic acoustic waves are focused successively into focusing regions having different shapes and/or dimensions.

2. The contactless detection device according to claim 1, wherein the detection surface corresponds to a first face of a material plate, and wherein the plurality of actuators are secured to a second face, opposite to the first face, of the material plate.

3. The contactless detection device according to claim 2, wherein the material plate has a thickness between 0.1 mm and 3 mm and/or includes a material whose Young's modulus is between 50 GPa and 300 GPa, and/or such that a ratio of a volumetric mass of the material plate to the Young's modulus of the plate material is between $20.10^{-8}$ kg/m·N and $50.10^{-8}$ kg/m·N.

4. The contactless detection device according to claim 1, wherein the ultrasonic acoustic wave detector includes at least one microphone and/or acoustic transducers disposed over the detection surface.

5. The contactless detection device according to claim 1, wherein the ultrasonic acoustic wave detector is formed by the plurality of actuators configured to emit the ultrasonic acoustic waves, and which are further configured to perform an acoustic transduction.

6. The contactless detection device according to claim 5, wherein the processing circuitry is further configured to apply a second time reversal method to the echo of the detection ultrasonic acoustic waves received by each of the plurality of actuators.

7. The contactless detection device according to claim 1, wherein the plurality of actuators are configured to emit ultrasonic acoustic waves whose frequencies are between 20 kHz and 100 kHz.

8. The contactless detection device according to claim 1, wherein the processing circuitry is further configured to measure a frequency shift between the emitted detection ultrasonic acoustic waves and the echo of the detection ultrasonic acoustic waves, and calculate a speed of movement of the detected elements from the measured frequency shift.

9. The contactless detection device according to claim 1, wherein the processing circuitry is further configured to encode the control signals prior to the emission of the ultrasonic acoustic waves.

10. A contactless interaction device, comprising:
the contactless detection device according to claim 1, and
circuitry configured to perform one or more actions according to a result of the detection performed by the contactless detection device.

11. The contactless interaction device according to claim 10, the contactless interaction device forming a human-machine interface comprising a display surface to which the detection surface of the contactless detection device is secured.

12. A method for controlling a contactless detection device according to claim 1, the method comprising:
   calculating, by the processing circuitry, the control signals from the measurement of the audio impulse response and/or the vibratory impulse response of the detection surface that was generated by the emission of the calibration ultrasonic acoustic waves emitted by each of the plurality of actuators, and the application of a first time reversal method to the audio impulse response and/or to the vibratory impulse response of the detection surface,
   applying the calculated control signals on the plurality of actuators, focusing the detection ultrasonic acoustic waves emitted by the plurality of actuators into the focusing region belonging to the plane opposite the detection surface, and
   measuring the duration between the emission of the detection ultrasonic acoustic waves and the reception of the echo of the detection ultrasonic acoustic waves by the ultrasonic acoustic wave detector,
   wherein the above steps are repeated the plurality of times such that the calculated control signals focus the detection ultrasonic acoustic waves successively into focusing regions having the different shapes and/or dimensions.

13. The method according to claim 12, further comprising calibrating the contactless detection device comprising by:
   emitting the calibration ultrasonic acoustic waves by each of the plurality of actuators;
   measuring the audio impulse response and/or the vibratory impulse response of the detection surface generated by the emission of the calibration ultrasonic acoustic waves;
   applying the first time reversal method to the audio impulse response and/or to the vibratory impulse response of the detection surface; and
   storing the signals obtained by applying the first time reversal method to the audio impulse response and/or to the vibratory impulse response of the detection surface.

14. The method according to claim 12, further comprising detecting a position or a movement of one or more fingers of a user of the contactless detection device.

* * * * *